(12) United States Patent
Zhang et al.

(10) Patent No.: US 7,990,660 B2
(45) Date of Patent: Aug. 2, 2011

(54) MULTIPLE CCP LAYERS IN MAGNETIC READ HEAD DEVICES

(75) Inventors: Kunliang Zhang, Milpitas, CA (US); Min Li, Dublin, CA (US); Yu-Hsia Chen, Mountain View, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 12/930,756

(22) Filed: Jan. 14, 2011

(65) Prior Publication Data

US 2011/0117388 A1    May 19, 2011

Related U.S. Application Data

(62) Division of application No. 11/704,399, filed on Feb. 9, 2007, now Pat. No. 7,872,838.

(51) Int. Cl.
*G11B 5/127* (2006.01)

(52) U.S. Cl. ........................................................ 360/324

(58) Field of Classification Search .................. 360/324, 360/324.2, 324.1, 324.11, 324.12, 264.7, 360/264.9; 29/603.13, 603.14
See application file for complete search history.

(56) References Cited

U.S. PATENT DOCUMENTS

| | | | |
|---|---|---|---|
| 7,046,489 B2 | 5/2006 | Kamiguchi et al. | |
| 7,050,276 B2 | 5/2006 | Nishiyama | |
| 7,196,877 B2 | 3/2007 | Yoshikawa et al. | |
| 7,309,449 B2 * | 12/2007 | Ono et al. | 216/83 |
| 7,331,100 B2 | 2/2008 | Li et al. | |
| 7,405,906 B2 | 7/2008 | Funayama et al. | |
| 7,428,127 B2 | 9/2008 | Nagasaka et al. | |
| 7,525,776 B2 | 4/2009 | Fukuzawa et al. | |
| 7,538,987 B2 | 5/2009 | Fujiwara et al. | |
| 7,610,674 B2 | 11/2009 | Zhang et al. | |
| 2005/0094317 A1 | 5/2005 | Funayama | |

* cited by examiner

*Primary Examiner* — Allen T Cao

(74) *Attorney, Agent, or Firm* — Saile Ackerman LLC; Stephen B. Ackerman

(57) ABSTRACT

An improved CPP magnetic read device whose oxide barrier comprises at least two separate CCP layers is disclosed. These two CCP layers differ in the PIT and IAO treatments that they received relative to the PIT/IAO treatment that would be used when only a single CCP layer is formed.

7 Claims, 4 Drawing Sheets

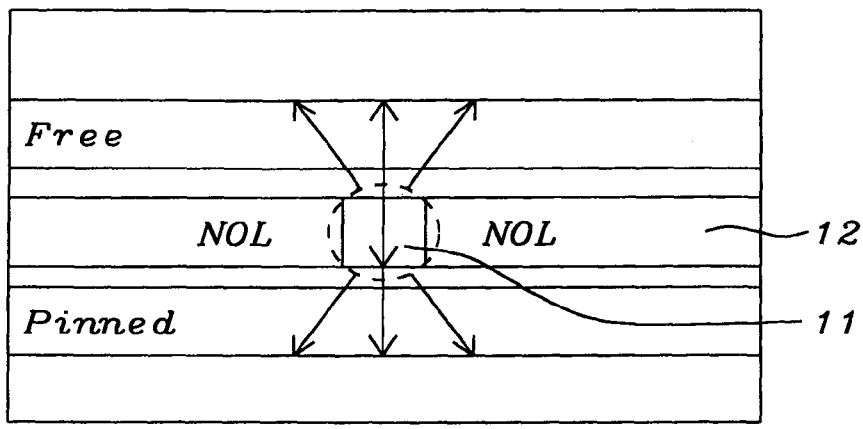
FIG. 1 - Prior Art
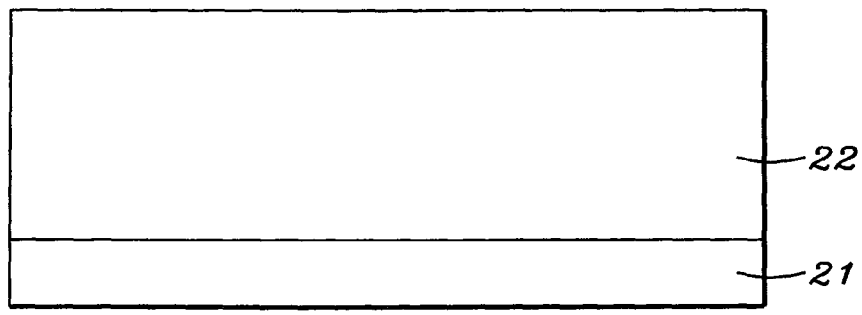
FIG. 2a - Prior Art
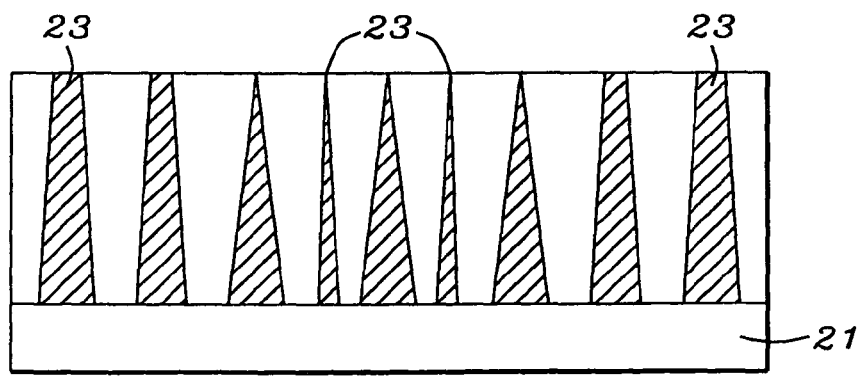
FIG. 2b - Prior Art

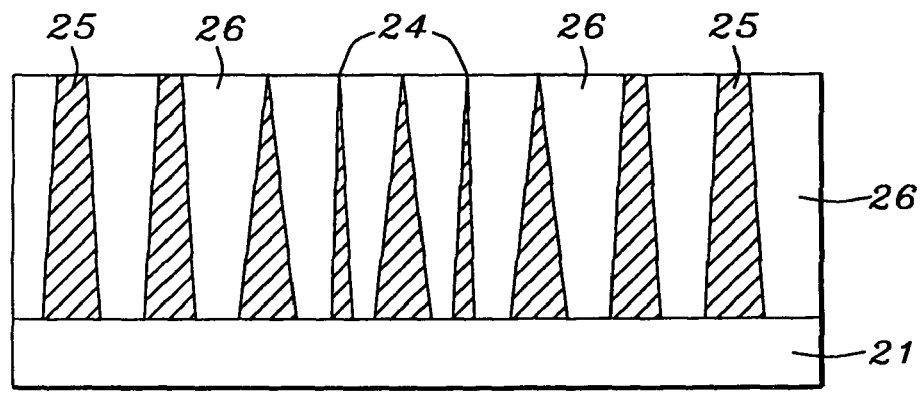
FIG. 2c – Prior Art
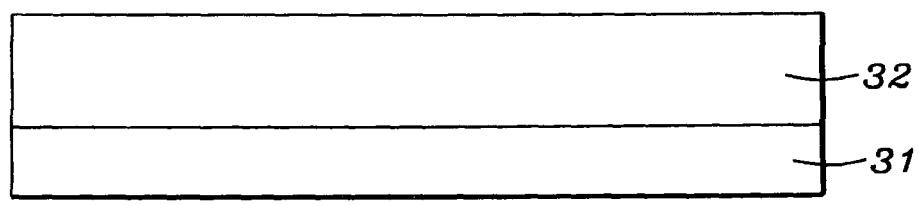
FIG. 3
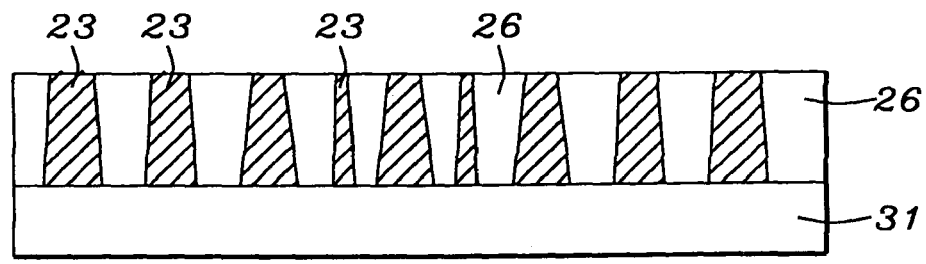
FIG. 4

MULTIPLE CCP LAYERS IN MAGNETIC READ HEAD DEVICES

This is a divisional application of U.S. patent application Ser. No. 11/704,399, filed on Feb. 9, 2007, now U.S. Pat. No. 7,872,838 which is herein incorporated by reference in its entirety, and assigned to a common assignee.

Related application: application Ser. No. 11/352,676, filed on Feb. 13, 2006, and herein incorporated, by reference, in its entirety.

FIELD OF THE INVENTION

The invention relates to the general field of CPP (current perpendicular to plane) memory devices with particular reference to CCP (current confined path) versions of these devices.

BACKGROUND OF THE INVENTION

CPP-GMR heads are considered to be promising candidates for ultra-high density magnetic recording. In a typical CPP-GMR head structure, a bottom synthetic spin valve type film stack is used for biasing reasons, together with a conventional CoFe/NiFe composite free layer, following traditions derived from CIP (current in plane) GMR (giant magneto-resistance) developments.

Two different configurations are possible for a CPP-GMR structure. The older of these is a "metallic" CPP-GMR, in which the spacer is a Cu layer. A typical structure this type would look as follows:

Seed/AFM/AP2/Ru/AP1/Cu/free layer/capping layer where AFM is the antiferromagnetic layer and AP1 and AP2 are anti-parallel layers.

The other more recent configuration is the CCP version in which the current path through the Cu spacer is restricted to narrow zone 11 which is embedded in insulation 12, as illustrated schematically in FIG. 1. Layer 12 is an example of a NOL (nano-oxide layer). Incorporation of a current confining scheme of this type serves to further improve the performance of a CPP GMR device. A typical structure of this type would look as follows:

Seed/AFM/AP2/Ru/AP1/Cu/CCP-layer/Cu/free layer/capping layer

In practice, an approximation of the idealized structure seen in FIG. 1 is realized, as illustrated, in FIG. 2a, by first laying down layer of copper 21 followed by layer 22 of either AlCu or pure Al. This structure is then subjected to PIT (plasma ion treatment), as illustrated in FIG. 2b, which causes conductive regions 23 to precipitate out as conductive paths through the remaining material. The process concludes, as shown in FIG. 2c, with the application of IAO (ion assisted oxidation) which oxidizes the more chemically active regions, converting them to dielectric 26 (aluminum oxide in this example) while leaving in place conductive regions 23. The latter are relatively pure copper. It is important to note that conductive regions 23 tend to be needle-like, as in regions 24, or butt-ended as in regions 25.

In earlier work, CCP-CPP GMR performance was greatly enhanced through improvements in AP1 and the free layer together with optimization of the PIT and IAO processes. However, some concern remains as to the uniformity of these CCP-CPP GMR designs.

A CCP-CPP GMR wafer that is representative of current designs, would have a film structure as follows:

Ta10/Ru10/IrMn70/Fe10% Co8/Fe70% Co10.5/
Fe10% Co16/Ru7.5/Fe70% Co12/Cu2/Fe70%
Co12/Cu5.2/AlCu8.6/PIT(20 w,35 sec)/IAO(27
W,40 sec)//Cu3//CoFe12/NiFe35/Ru10/Ta60/
Ru30 where a thin Ta/Ru layer has been employed as the seed layer, IrMn as the AFM material, FCC-like CoFe/FeCo/FeCo tri-layer structure as the AP2 layer, FeCo with Cu insertion as the AP1 layer, Fe25% Co/CoFeB/Ni90% Fe as the free layer and a Ru/Ta/Ru trilayer as the capping layer.

The most critical part of this CCP-CPP GMR sensor, the current confining path, was realized through the steps of Cu/AlCu/PIT/IAO/Cu. After bottom Cu deposition, a thin AlCu layer is deposited thereon. This AlCu layer is then exposed to oxygen by means of the PIT/IAO process to form a current confining path through $Al_2O_3$ and Cu segregation. It is well known that Al atoms have different mobility from Cu atoms. After the PIT treatment, Al and Cu start to segregate from each other. Once they are exposed to oxygen, Al atoms attract oxygen and form amorphous AlOx. Since Cu is chemically more inert to $O_2$ than Al under the current process conditions, it tends to remain as a Cu metal phase. Thus, throughout the PIT/IAO process the Al will be continuously oxidized to AlOx while the Cu remains in a metallic state, eventually forming metal paths in the form of copper filaments.

Since the PIT/IAO processes are performed through the top surface of the AlCu layer, it inevitably results in a large variety of Cu metal path types, from top to bottom and across the whole wafer, causing large variations across the wafer in R.A and dR/R for all devices. Some metal paths will be needle-like with a very narrow path from top to bottom, especially near the top. Such a needle-like metal path will typically cause a higher R.A as well as a slightly larger dR/R. Also, some metal paths will be butte like, which will result in a lower R.A and dR/R. Between these extremes there will be spear-like metal paths with intermediate R.A and dR/R. It is readily deduced that that it is these large variations in the shapes of the metal paths that cause the uniformity problems.

To investigate further, a reference CPP-GMR sensor with the following film structure was formed using the conventional PIT/IAO process. Each value next to the individual layer indicates the film thickness in angstroms:

Ta10/Ru10/IrMn70/Fe10% Co8/Fe70% Co10.5/
Fe10% Co16/Ru7.5/Fe70% Co12/Cu2/Fe70%
Co12/Cu5.2/AlCu8.6/PIT(20 w,35 sec)/IAO(27
W,40 sec)//Cu3/CoFe12/NiFe35/Ru10/Ta60/
Ru30

The uniformity data (displayed as 1 sigma in percentage) for dR/R, dR and R across the wafer are shown in Table 1. Typically under the conventional PIT/IAO process, the dR/R uniformity averaged about 9.5% (1 sigma), dR uniformity averaged about 24.7%, and R averaged about 18.2%, all due to the large variations of Cu metal path difference. Optimizing and homogenizing these Cu paths is thus the key to improving wafer uniformity.

TABLE 1 dR/R, dR and R uniformity data for various device sizes for structures formed using the conventional PIT/IAO process

| Chip site | free layer length (μm) | Area (μm)$^2$ | dR/R uniformity | dR uniformity | R uniformity |
|---|---|---|---|---|---|
| #1 | 0.61 | 0.29 | 11.2 | 25.3 | 15.7 |
| #2 | 0.49 | 0.19 | 8.7 | 22.6 | 16.7 |

TABLE 1-continued dR/R, dR and R uniformity data for various device sizes for
structures formed using the conventional PIT/IAO process

| Chip site | free layer length (μm) | Area (μm)² | dR/R uniformity | dR uniformity | R uniformity |
|---|---|---|---|---|---|
| #3 | 0.80 | 0.52 | 12.1 | 23.8 | 13.7 |
| #4 | 0.37 | 0.11 | 9.0 | 26.5 | 20.0 |
| #5 | 0.30 | 0.07 | 7.4 | 26.4 | 20.9 |
| #6 | 0.24 | 0.05 | 8.8 | 23.6 | 22.3 |
| mean | 0.47 | 0.21 | 9.5 | 24.7 | 18.2 |

The present invention discloses a process, and related structure, that significantly improve the uniformity of CCP-CPP designs.

A routine search of the prior art was performed with the following references of interest being found:

U.S. Pat. No. 7,050,276 (Nishiyama) discloses forming a current limiting layer of Al on a non-magnetic layer, plasma oxidation of the Al layer, and then filling the holes with a conductive layer. U.S. Pat. No. 7,046,489 (Kamiguchi et al) teaches a resistance-regulating layer such as Al—Co that is oxidized such as by plasma oxidation to form pinholes. U.S. Patent Application 2006/0098353 (Fukuzawa et al) teaches PIT or IAO oxidation of AlCu. U.S. Patent Application 2006/0007605 ILi et al—Headway) shows IAO of an AlCu layer.

U.S. Patent Application 2005/0002126 (Fujiwara et al) discloses a current-confining layer structure formed of a conductor and an insulator. The conductor may be Al, Mg, Cr, Cu, etc. U.S. Patent Application 2005/0152076 (Nagasaka et al) teaches that oxidation of a magnetic layer results in a current-confining effect. Oxidation of a magnetic intermediate layer such as CoFe between two layers of Cu is taught.

U.S. Patent Applications 2005/0094317 (Funayama) and 2005/0052787 (Funayama et al) shows a current control region comprising AlOx and Cu. Mg or Cr could be used with a copper content of 1% to 50%. U.S. Patent Application 2004/0190204 (Yoshikawa et al) shows an intermediate layer comprising Cu/oxidized AlCu/Cu where AlCu is oxidized by IAO.

SUMMARY OF THE INVENTION

It has been an object of at least one embodiment of the present invention to improve uniformity among a plurality of current confined paths that are formed at the same time on a common substrate.

Another object of at least one embodiment of the present invention has been to improve state of the art practice rather than replacing it, thereby causing minimum disruption of existing production lines.

Still another object of at least one embodiment of the present invention has been to provide both a method and a structure as the means for achieving the afore-mentioned goals.

A further object of at least one embodiment of the present invention has been that said method and structure be suitable for incorporation as part of manufacturing both CCP-CPP GMR and MTJ devices.

These objects have been achieved by adding at least one additional CCP layer while forming the CCP portion of the device. Additionally, the PIT and IAO processes used during the formation of both layers are applied for a shorter time than has been the practice when only a single CCP layer is formed.

As in the prior art, the PIT and AIO treatments result in the formation of copper filaments that span the thickness of the CCP layer. Said filaments vary in both width and in the extent to which they are tapered. The effect of using the process of the present invention is to terminate, at the interface between the two dielectric layers, those of the copper filaments whose diameter is below some critical value. This results in only relatively thick filaments making it all the way to the next conductive layer and has the effect of significantly improving the uniformity of the performance characteristics of a plurality of memory elements that are formed on the same substrate at the same time.

BRIEF DESCRIPTION OF THE DRAWINGS

FIG. 1 is a schematic cross-section of a current confined path.

FIGS. 2a-2c illustrate the basic steps of the prior art process.

FIGS. 3 and 4 show the initial steps of the present invention (that are similar to the prior art).

DESCRIPTION OF THE PREFERRED EMBODIMENTS

We now disclose a solution to the problems discussed above. The key feature of this is the introduction of two separate PIT/IAO processes on each of two separate AlCu or Al layers.

Referring now to FIG. 3, the general process starts, as in the prior art, with the deposition of layer 32 of Al or AlCu on copper layer 31. The structure of FIG. 3 is then subjected to successive PIT and IAO treatments under similar conditions as in the prior art process discussed above, but for a shorter time—about 20 seconds rather than about 35 seconds—which is sufficient time for conductive paths 23 to form, as seen in FIG. 4.

Figure 5:
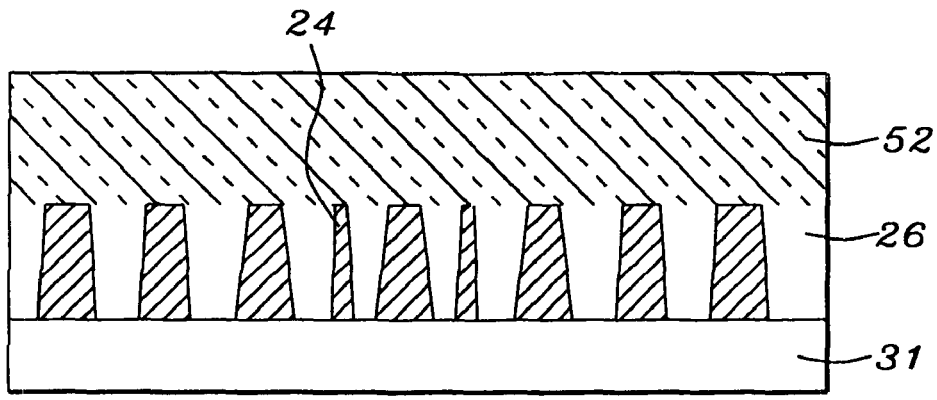
FIGS. 5-7 illustrate additional steps introduced as part of the present invention.
Figure 6:
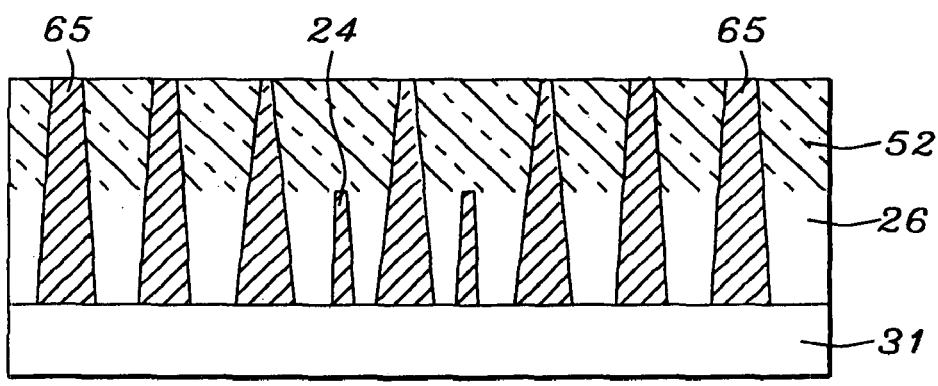
Figure 7:
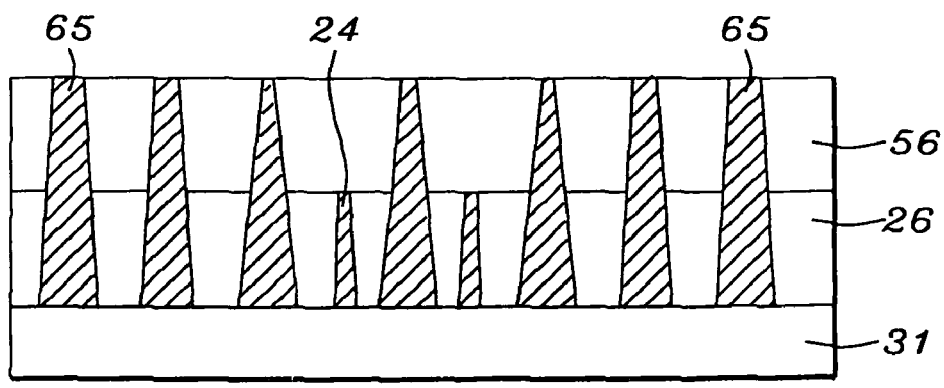

Then, in a sharp departure from prior art practice, second layer of Al or AlCu 52 is deposited onto the structure of FIG. 4, as illustrated in FIG. 5. This is followed by successive PIT and IAO treatments under similar conditions and times as were used to produce the structure of FIG. 4. FIG. 6 shows the structure following the second PIT treatment while FIG. 7 shows the final structure following the second IAO treatment.

It can be seen in FIG. 6 that, while the growth of relatively narrow (needle-like) paths such as 24 has been terminated at the interface between the two layers 26 and 52, that of relatively wide paths, such as 65 has not but has continued all the way to the upper surface.

Figure 8:
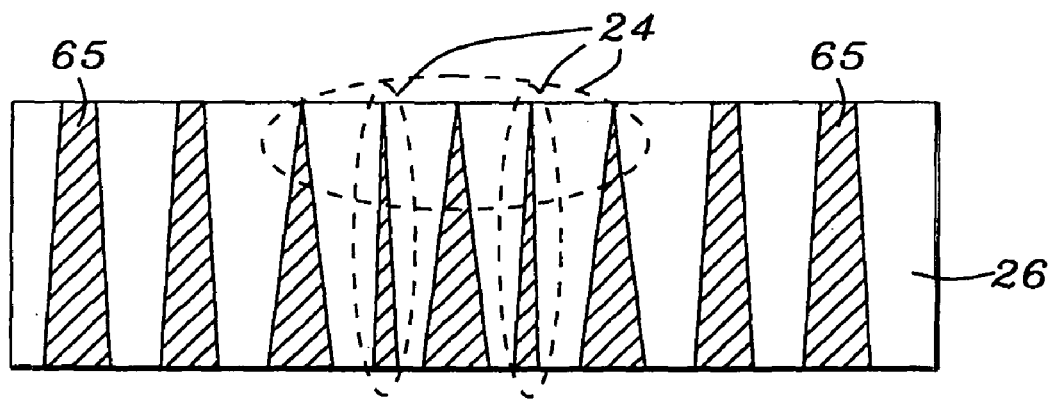
FIGS. 8 and 9 provide an explanation of how the present invention achieves improved uniformity between a plurality of current confined paths formed at the same time.
Figure 9:
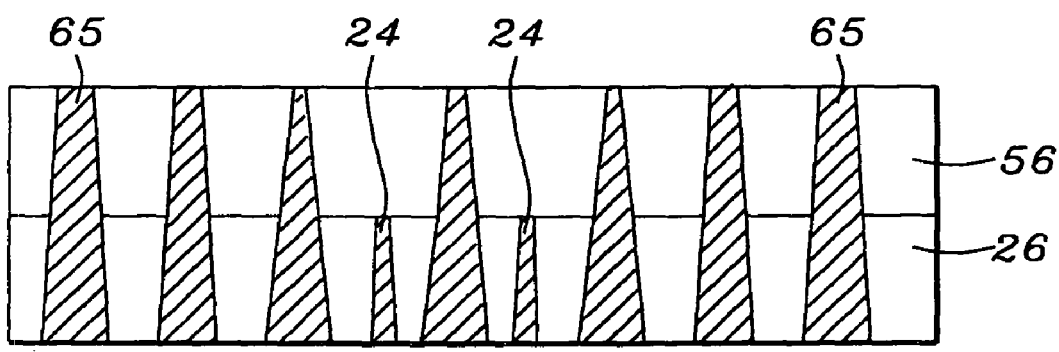

This key feature of the invention is further emphasized in FIGS. 8 and 9 which show that the cross-sectional areas of the needle-like paths 24 at the top surface of layer 26 (FIG. 8) are much smaller than that of the wider paths. It is speculated that the areas in question are therefore too small to serve as efficient nucleation sites for the further growth of copper. Regardless of the underlying mechanisms, however, the net result is as shown in FIG. 9 and its effectiveness is confirmed by the improvements in uniformity which will be presented later.

1st Embodiment

A CPP-GMR sensor having the following film structure was formed. Each value next to the individual layer indicates the film thickness in angstroms.

Ta10/Ru10/IrMn70/Fe10% Co8/Fe70% Co10.5/
Fe10% Co16/Ru7.5/Fe70% Co12/Cu2/Fe70%
Co12/Cu5.2/AlCu4.3/PIT(20 w,20 sec)/IAO(27
W,20 sec)/AlCu4.3/PT(20 w,20 sec)/RFIAO(27
W,20 s)/Cu3/CoFe12/NiFe35/Ru10/Ta60/Ru30

As implied by the notation employed above, for this embodiment, two separate PIT/IAO processes were performed on each of two separately deposited AlCu layers. Shown in table 2 are uniformity, dR/R, dR, and R values associated with structures made using this embodiment. Comparing table 1 with table 2, it is clearly seen that the uniformity has been greatly improved with the new process. This indicates that, with the new process, the variations of the Cu paths have been reduced by at least two times.

TABLE 2 dR/R, dR and R uniformity data for various device sizes in structures formed using the first embodiment of the present invention.

| Chip site | free layer length (μm) | Area (μm)$^2$ | dR/R uniformity | dR uniformity | R uniformity |
|---|---|---|---|---|---|
| #1 | 0.61 | 0.29 | 2.61 | 8.51 | 6.95 |
| #2 | 0.49 | 0.19 | 3.06 | 9.04 | 7.81 |
| #3 | 0.80 | 0.52 | 2.19 | 6.12 | 4.57 |
| #4 | 0.37 | 0.11 | 3.49 | 11.54 | 11.34 |
| #5 | 0.30 | 0.07 | 3.97 | 12.37 | 10.72 |
| #6 | 0.24 | 0.05 | 4.36 | 10.26 | 9.38 |
| mean | 0.47 | 0.19 | 3.28 | 9.64 | 8.36 |

2nd Embodiment

A CPP-GMR sensor having the following film structure was formed. As before, each value next to the individual layer indicates the film thickness in angstroms.

Ta10/Ru10/IrMn70/Fe10% Co8/Fe70% Co10.5/
Fe10% Co16/Ru7.5/Fe70% Co12/Cu2/Fe70%
Co12/Cu5.2/Al/PIT/IAO/Al/PIT/IAO/Cu3//
CoFe12/NiFe35/Ru10/Ta60/Ru30

For this embodiment, two separate Al layers were used in place of the thin AlCu layers of the first embodiment. The resulting uniformity data is summarized in Table 3 below. As can be seen, the uniformities of dR/R, dR and R are all improved.

TABLE 3 dR/R, dR and R uniformity data for various device sizes in structures formed using the second embodiment of the present invention.

| Chip site | free layer length (μm) | Area (μm)$^2$ | dR/R uniformity | dR uniformity | R uniformity |
|---|---|---|---|---|---|
| #1 | 0.61 | 0.29 | 3.07 | 5.56 | 3.21 |
| #2 | 0.49 | 0.19 | 3.02 | 7.69 | 5.36 |
| #3 | 0.80 | 0.52 | 2.50 | 4.69 | 2.80 |
| #4 | 0.37 | 0.11 | 3.60 | 7.80 | 7.31 |
| #5 | 0.30 | 0.07 | 3.65 | 8.67 | 7.26 |
| #6 | 0.24 | 0.05 | 4.46 | 13.66 | 12.72 |
| mean | 0.47 | 0.21 | 3.38 | 8.01 | 6.44 |

3rd Embodiment

A CPP-GMR sensor having the following film structure was formed. As before, each value ext to the individual layer indicates the film thickness in angstroms.

Ta10/Ru10/IrMn70/Fe10% Co8/Fe70% Co10.5/
Fe10% Co16/Ru7.5/Fe70% Co12/Cu2/Fe70%
Co12/Cu3/AlCu4.3/PIT(20 W17 s)/IAO(27
W20 s)/Cu3/AlCu4.3/PIT (20 W17 s)/IAO(27
W20 s)/Cu3//CoFe12/NiFe35/Ru10/Ta60/Ru30

For this embodiment, two separate AlCu layers were used, as in the first embodiment, with the added refinement that a thin layer of copper was deposited onto the first AlCu layer following its PIT and IAO treatments, bur prior to the deposition of the second AlCu layer. The resulting uniformity data is summarized in Table 4 below.

TABLE 4 dR/R, dR and R uniformity data for various device sizes in structures formed using the third embodiment of the present invention.

| Chip site | free layer length (μm) | Area (μm)$^2$ | dR/R uniformity | dR uniformity | R uniformity |
|---|---|---|---|---|---|
| #1 | 0.61 | 0.29 | 2.93 | 5.98 | 4.47 |
| #2 | 0.49 | 0.19 | 4.34 | 8.45 | 5.91 |
| #3 | 0.80 | 0.52 | 2.29 | 5.65 | 3.52 |
| #4 | 0.37 | 0.11 | 4.16 | 10.69 | 8.80 |
| #5 | 0.30 | 0.07 | 4.82 | 10.39 | 9.68 |
| #6 | 0.24 | 0.05 | 4.57 | 10.52 | 9.50 |
| mean | 0.38 | 0.21 | 3.85 | 8.61 | 6.98 |

Note that although the embodiments described above employed either AlCu or Al as the material for the layers to be subjected to the PIT and IAO processes, it is possible to use, for these layers, almost any material that is more readily oxidized than Cu. Examples of such materials include, but are not limited to, Mg, MgCu, Ti, Cr, Zr, Ta, Hf, and Fe as well as their alloys.

What is claimed is:

1. A current confining layer, comprising:
   a layer of copper on a substrate;
   on said copper layer, a first layer of a dielectric material having a first upper surface;
   first filaments of copper, embedded in said dielectric layer, extending from said copper layer to said first upper surface;
   on said first upper surface, a second layer of a dielectric material having a second upper surface;
   second filaments of copper, embedded in said second dielectric layer, extending from said first upper surface to said second upper surface, said second filaments bring continuations of said first filaments only where said first filaments have a diameter, at said first upper surface, that exceeds a critical value.

2. The current confining layer described in claim 1 further comprising additional dielectric layers in each of which are embedded copper filaments, similar to and subject to similar constraints as, said second copper filaments.

3. The current confining layer described in claim 2 further comprising an additional copper layer between each of said dielectric layers.

4. The current confining layer described in claim 1 further comprising, on an uppermost dielectric layer, a copper spacer layer on which is a magnetically free layer, and wherein said substrate further comprises a magnetically pinned layer on a magnetic pinning layer whereby said current confining layer is part of a CCP-CPP GMR device.

5. The current confining layer described in claim 1 further comprising, on an uppermost dielectric layer, a tunneling insulation layer on which is a magnetically free layer, and wherein said substrate further comprises a magnetically pinned layer on a magnetic pinning layer whereby said current confining layer is part of a CPP-MTJ device.

6. The current confining layer described in claim 1 wherein each of said dielectric layers is an oxide of a material selected from the group consisting of Al, Mg, Ti, Hf, Cr, Zr, Fe, and Ta.

7. The current confining layer described in claim 1 wherein each of said dielectric layers has a thickness in the range of from about 2 to 20 Angstroms.

* * * * *